United States Patent
Li et al.

(10) Patent No.: US 12,429,289 B2
(45) Date of Patent: Sep. 30, 2025

(54) CAPILLARY STRUCTURE AND HEAT DISSIPATION DEVICE THEREOF

(71) Applicant: ASIA VITAL COMPONENTS (CHINA) CO., LTD., Shenzhen (CN)

(72) Inventors: Zhiwei Li, Shenzhen (CN); Jingli Wang, Shenzhen (CN); Hanmin Liu, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 181 days.

(21) Appl. No.: 18/237,397

(22) Filed: Aug. 23, 2023

(65) Prior Publication Data

US 2025/0067520 A1   Feb. 27, 2025

(51) Int. Cl.
| | |
|---|---|
| F28D 15/04 | (2006.01) |
| B81C 1/00 | (2006.01) |
| F28D 15/02 | (2006.01) |
| F28D 21/00 | (2006.01) |

(52) U.S. Cl.
CPC ........ F28D 15/046 (2013.01); B23P 2700/50 (2013.01); B81C 1/00111 (2013.01); B81C 1/00119 (2013.01); F28D 15/0283 (2013.01); F28D 2021/0029 (2013.01)

(58) Field of Classification Search
CPC ............. F28D 15/046; F28D 15/0283; F28D 15/0233; F28D 2021/0029; B81C 1/00111; B81C 1/00119; B23P 2700/50; H05K 7/20336
USPC ..................................................... 165/104.26
See application file for complete search history.

(56) References Cited

U.S. PATENT DOCUMENTS

| | | | |
|---|---|---|---|
| 2018/0259268 A1* | 9/2018 | Zhou | F28D 15/046 |
| 2019/0239395 A1* | 8/2019 | Joshi | F28D 15/046 |
| 2020/0103176 A1* | 4/2020 | Ben-Menahem | F28D 15/0266 |

(Continued)

FOREIGN PATENT DOCUMENTS

| | | |
|---|---|---|
| CN | 110708931 A | 1/2020 |
| TW | 200733854 A | 9/2007 |

OTHER PUBLICATIONS

Search Report dated Jan. 2, 2024 issued by Taiwan Intellectual Property Office for counterpart application No. 112131357.

*Primary Examiner* — Joel M Attey
(74) *Attorney, Agent, or Firm* — Demian K. Jackson; Jackson IPG PLLC

(57) ABSTRACT

A capillary structure and a heat dissipation device thereof are disclosed. The capillary structure is applied to a two-phase fluid heat dissipation device. The capillary structure has a main body having an internal closed space. The main body has a top layer formed with multiple passages in communication with the closed space of the main body. Multiple column bodies are disposed in the closed space. The column bodies and the passages are staggered from each other. The heat dissipation device has an internal airtight chamber. A working fluid is filled in the airtight chamber. The capillary structure is disposed in the airtight chamber. The capillary structure provides respective bypass paths for the vapor working fluid and the liquid working fluid. Accordingly, the liquid working fluid and the vapor working fluid in the capillary structure will not interfere with each other or be interrupted by each other.

8 Claims, 4 Drawing Sheets

(56) References Cited

U.S. PATENT DOCUMENTS

2021/0161029 A1* 5/2021 Dede ................ G06F 1/203
2022/0214115 A1* 7/2022 Liu ................... F28D 15/02

* cited by examiner

CAPILLARY STRUCTURE AND HEAT DISSIPATION DEVICE THEREOF

BACKGROUND OF THE INVENTION

1. Field of the Invention

The present invention relates generally to a capillary structure and a heat dissipation device thereof, and more particularly to a capillary structure and a heat dissipation device thereof, which can provide independent circulation paths respectively for the vapor working fluid and the liquid working fluid. Accordingly, the liquid working fluid and the vapor working fluid will not obstruct or interfere with each other.

2. Description of the Related Art

In recent years, along with the rapid development of electronic equipments, the corresponding chip techniques have been rigorously developed. When the chip operates at high speed, the temperature of the chip will locally rise to generate high heat. In case the heat is not effectively and quickly dissipated, the heat will accumulate in the chip to greatly affect the performance and lifetime of the chip. In order to quickly dissipate the heat, a conventional two-phase transformation heat dissipation device is widely used to conduct the heat and heat-exchange with outer side. Vapor chambers, heat pipes, loop heat pipes, etc. are often used two-phase fluid heat dissipation device. With respect to the vapor chamber, in order to dissipate the heat generated by a high heat generation heat source, it is necessary to enhance the water content or water collection amount of the capillary structure in the evaporation section so as to avoid dry-out of the evaporation section due to insufficiency of the water content of the capillary structure. Therefore, the manufacturers conventionally employ thicker capillary structure or multilayer capillary structure to enhance the water content of the capillary structure in the evaporation section of the vapor chamber. However, when using thicker capillary structure or multilayer capillary structure to perform two-phase fluid heat exchange work, the flowing path or passage of the vapor working fluid is the same as the backflow path or passage of the condensed liquid working fluid. Therefore, the vapor working fluid and the liquid working fluid often interfere with or obstruct each other. As a result, the vapor working fluid is often interrupted in the voids of the capillary structure. Therefore, the vapor working fluid can hardly smoothly spread to the condensation section and the condensed liquid working fluid also can hardly flow back to the evaporation section. Consequently, the two-phase fluid vapor-liquid circulation will cease. Therefore, although the thicker capillary structure or multilayer capillary structure can enhance the water content, the vapor working fluid in the capillary structure and the liquid working fluid flowing back to the evaporation section will crowd out each other or interfere with each other to block the paths or passages.

It is therefore tried by the applicant to provide a capillary structure and a heat dissipation device thereof, which can prevent the vapor working fluid and the liquid working fluid from conflicting with each other during the phase change circulation. The capillary structure also can provide independent spreading and backflow paths respectively for the vapor working fluid and the liquid working fluid without interfering with each other. Accordingly, the liquid working fluid and the vapor working fluid in the capillary structure are prevented from interfering with or obstructing each other.

SUMMARY OF THE INVENTION

It is therefore a primary object of the present invention to provide a capillary structure and a heat dissipation device employing the capillary structure, which can divide the vapor working fluid and the liquid working fluid to prevent the vapor working fluid and the liquid working fluid from interfering with each other or crowding out each other to block the spreading and backflow paths.

To achieve the above and other objects, the capillary structure of the present invention includes a main body having at least one internal closed space. The main body has a top layer formed with multiple passages. The passages pass through the top layer in communication with the closed space, whereby the closed space and an external space of the main body can communicate with each other. Multiple column bodies are disposed in the closed space. The column bodies and the passages are staggered from each other. Two ends of the column bodies are respectively connected with a top side and a bottom side of the closed space.

Still to achieve the above and other objects, the heat dissipation device of the present invention has a heat dissipation device main body and a capillary structure. The heat dissipation device main body has an internal airtight chamber. A working fluid is filled in the airtight chamber. The heat dissipation device main body has an inner face proximal to the airtight chamber as a condensation face and another inner face proximal to the airtight chamber as an evaporation face. The capillary structure is disposed on the evaporation face. The top layer of the main body of the capillary structure is not in contact with the condensation face, whereby a two-phase fluid circulation space is defined between the top layer and the condensation face. The internal closed space of the main body of the capillary structure is in communication with the two-phase fluid circulation space through the multiple passages. After the working fluid is evaporated into vapor working fluid, the vapor working fluid can quickly spread to the two-phase fluid circulation space through the passages without being interfered with or obstructed by the liquid working fluid. Moreover, the condensed liquid working fluid also can quickly flow back to the heated section through the main body and the column bodies for next circulation. In the vapor-liquid circulation, the capillary structure of the present invention divides the vapor working fluid and the liquid working fluid and provides independent spreading and backflow paths respectively for the vapor working fluid and the liquid working fluid. Accordingly, the liquid working fluid and the vapor working fluid will not obstruct or interfere with each other. This greatly enhances the two-phase fluid circulation efficiency of the heat dissipation device.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
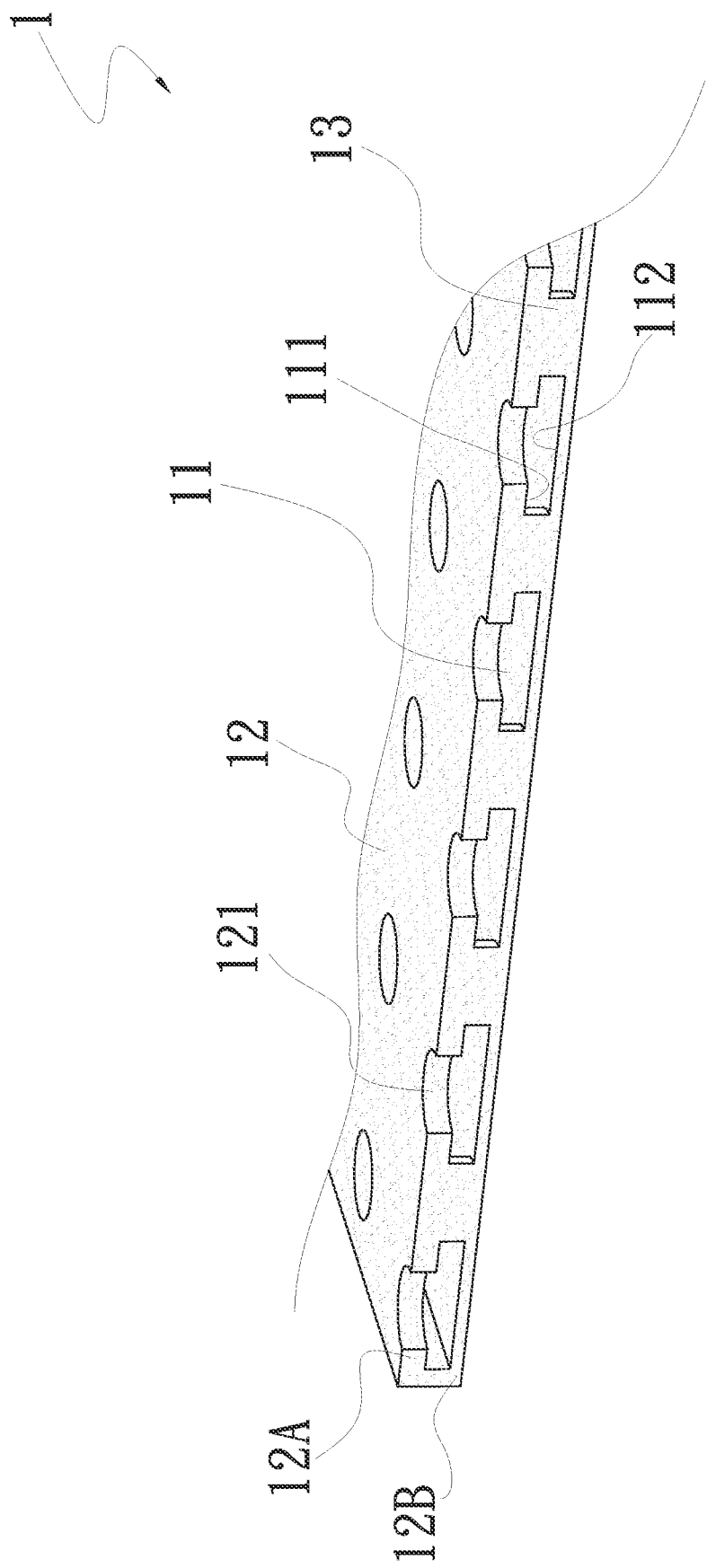
FIG. 1 is a sectional assembled view of the capillary structure of the present invention.
Figure 2:
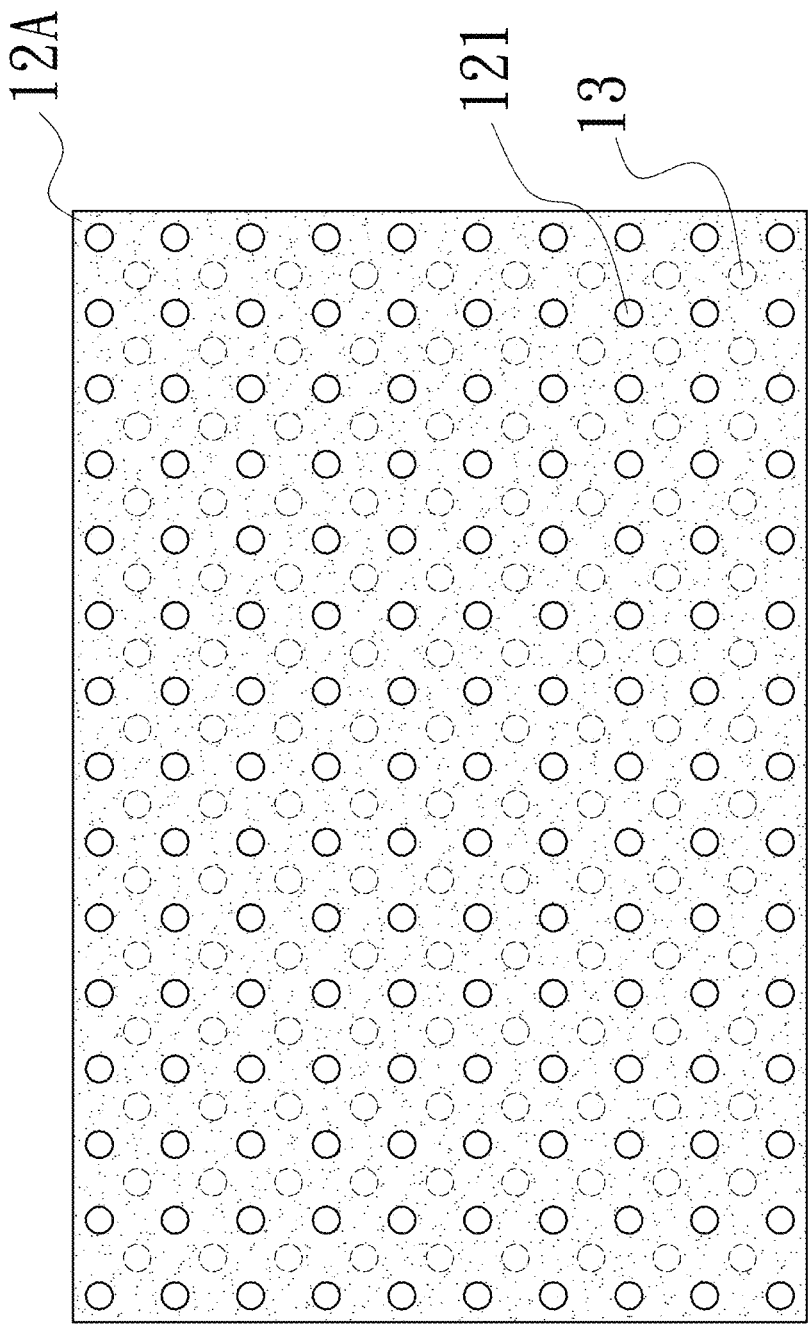
FIG. 2 is a top view of the capillary structure of the present invention.

Please refer to FIGS. 1 and 2. FIG. 1 is a sectional assembled view of the capillary structure of the present invention. FIG. 2 is a top view of the capillary structure of the present invention. The capillary structure of the present invention has a main body 1.

The main body 1 is a solid structure body formed of sintered powder. The main body 1 has at least one internal closed space 11 (or multiple space divisions). In addition, the main body 1 has a top layer 12A and a bottom layer 12B. The top layer 12A is formed with multiple passages 121 in communication with the closed space 11. An interior of the closed space 11 has a top side 111 and a bottom side 112. Multiple column bodies 13 are disposed in the closed space 11. (The column bodies 13 are sintered powder columns or copper columns). The column bodies 13 are vertically disposed in the closed space 11 and two ends of the column bodies 13 are respectively connected with the top side 111 and the bottom side 112 of the closed space 11. The column bodies 13 and the passages 121 are staggered from each other.

Figure 3:
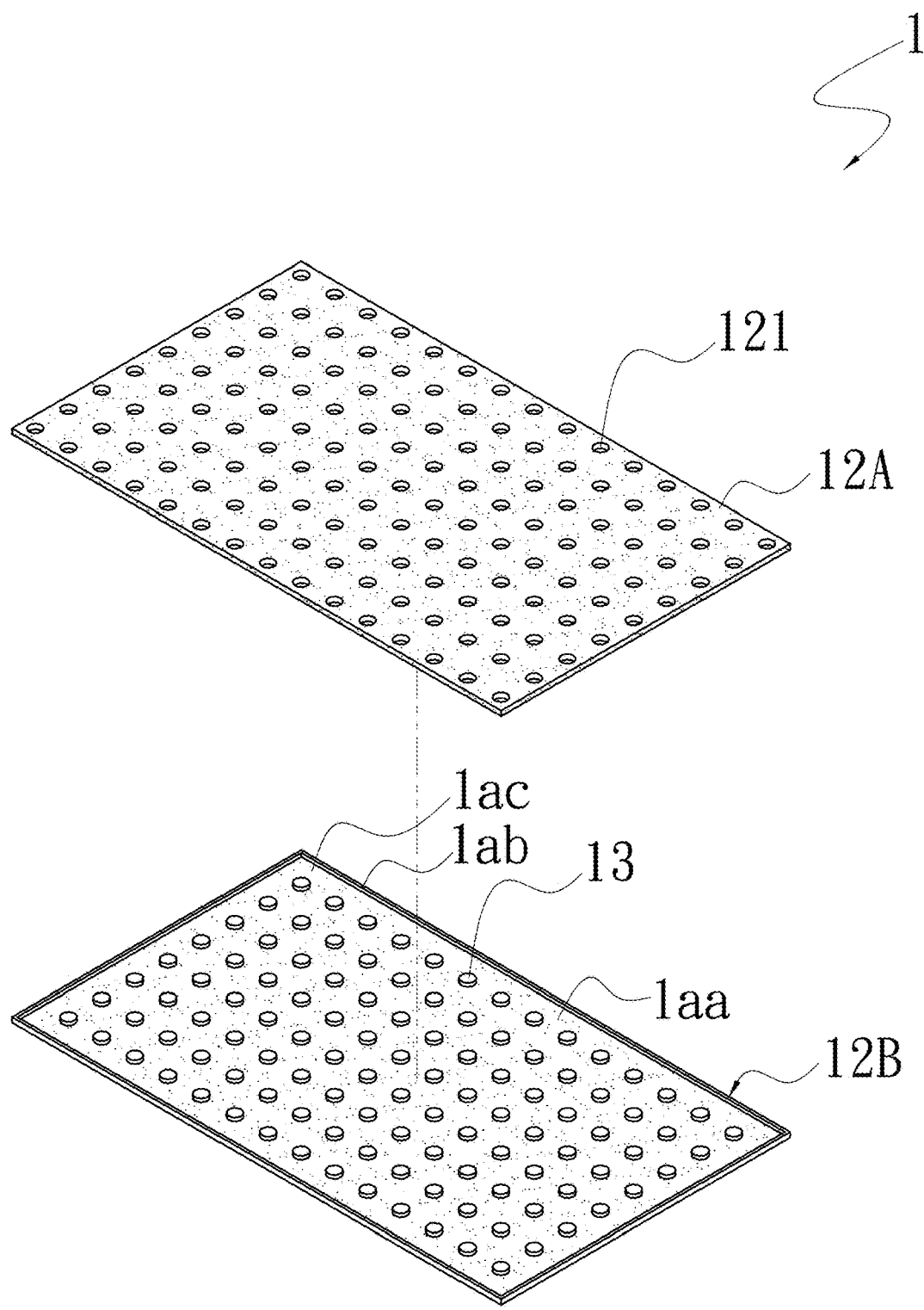
FIG. 3 is a perspective exploded view of the capillary structure of the present invention.

Please now refer to FIG. 3. The main body 1 can be divided into a bottom layer 12B and a top layer 12A. The thickness of the bottom layer 12B is smaller than or equal to the thickness of the top layer 12A. The bottom layer 12B and the top layer 12A can be the same sort of capillary structures or different sorts of capillary structures. In this embodiment, the thickness of the bottom layer 12B is thinner than the thickness of the top layer 12A. In addition, the bottom layer 12B has at least one sink 1aa. The sink 1aa has an open side 1ab and a closed side 1ac. The multiple column bodies 13 are disposed on the closed side 1ac or upward extend from the closed side 1ac of the sink 1aa. The passage 121 passes through the top layer 12A between the upper and lower sides of the top layer 12A. The top layer 12A is overlaid on the bottom layer 12B with the passages 121 and the column bodies 13 staggered from each other. The top layer 12A and the bottom layer 12B are integrally connected with each other by means of sintering, whereby the top layer 12A blocks the open side 1ab of the sink 1aa of the bottom layer 12B to define the internal closed space 11 of the main body 1.

Figure 4:
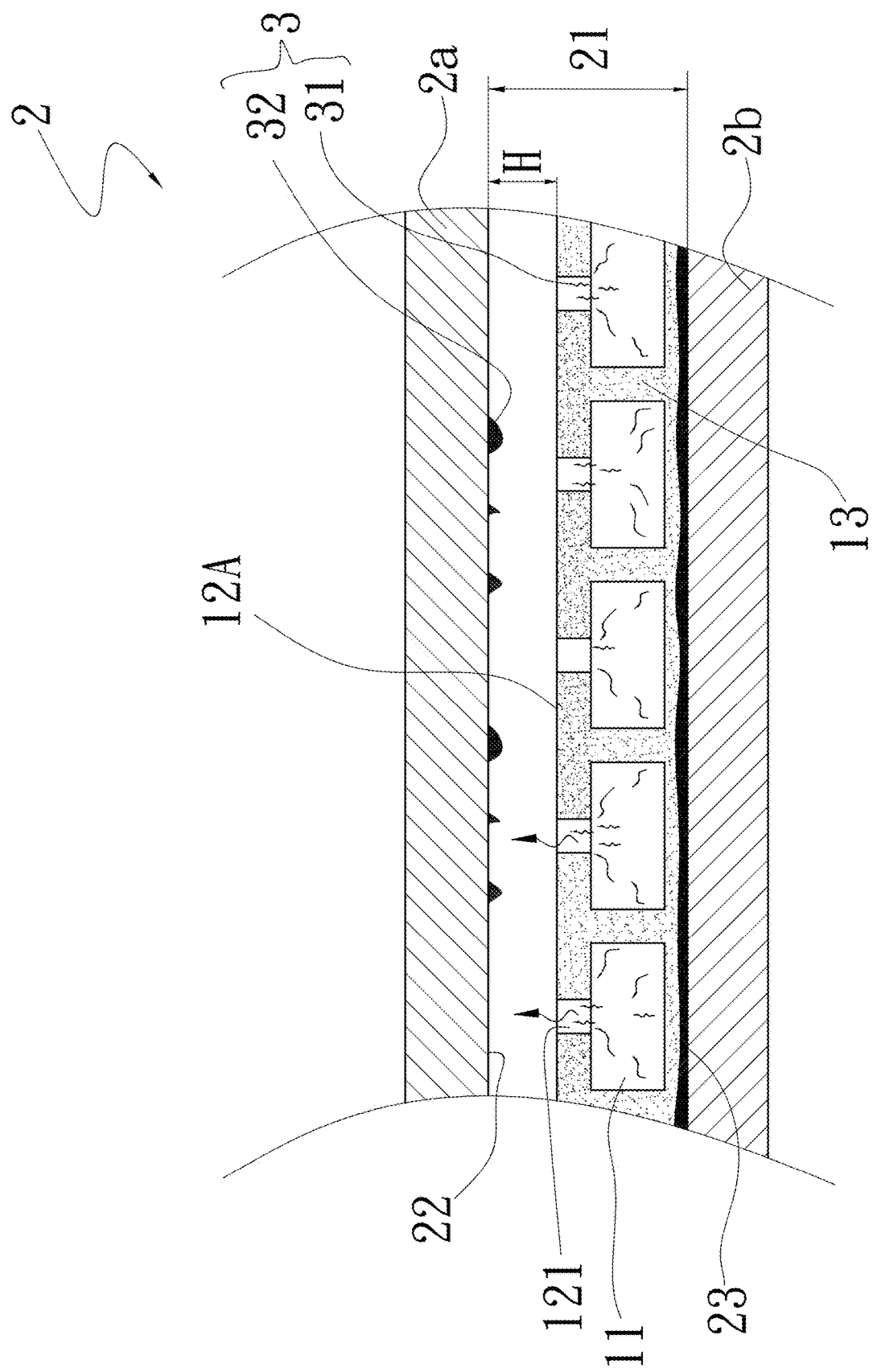
FIG. 4 is a sectional view of the heat dissipation device of the present invention.

Please now refer to FIG. 4, which is a perspective assembled sectional view of the heat dissipation device of the present invention. The heat dissipation device of the present invention has a heat dissipation device main body 2 and the main body 1 of the aforesaid capillary structure, which will not be redundantly described hereinafter.

In this embodiment, the heat dissipation device is, but not limited to, a vapor chamber for illustration purpose. The heat dissipation device main body 2 is composed of a first plate body 2a and a second plate body 2b, which are mated with each other to define an internal space as an airtight chamber 21. A working fluid 3 is filled in the airtight chamber 21. The first plate body 21 has an inner face proximal to the airtight chamber 21 as a condensation face 22, while the second plate body 2a has an inner face proximal to the airtight chamber 21 as an evaporation face 23. The main body 1 of the capillary structure is simply disposed on the surface of the evaporation face 23. In addition, a two-phase fluid circulation space H is formed between the top layer 12A of the main body 1 of the capillary structure and the condensation face 22. The top layer 12A of the main body 1 of the capillary structure is not in contact with the condensation face 22.

The closed space 11 is in communication with the two-phase fluid circulation space H through the multiple passages 121 of the top layer 12A of the main body 1 of the capillary structure. After the working fluid 3 is evaporated in the main body 1 of the capillary structure, the vapor working fluid 31 quickly spreads to the closed space and passes through the passages 121 between the closed space 11 and the two-phase fluid circulation space H to quickly spread from the closed space 11 to the two-phase fluid circulation space H without being obstructed or interrupted by the liquid working fluid 32.

After the vapor working fluid 31 on the condensation face 22 is condensed into the liquid working fluid 32, under gravity, the liquid working fluid 32 drops onto the top layer 12A of the main body 1 of the capillary structure. The liquid working fluid 32 is absorbed by the top layer 12A and quickly guided by the column bodies 13 to flow back the evaporation face 23 for the next vapor-liquid circulation. Accordingly, the vapor working fluid 31 and the liquid working fluid 32 respectively have their spreading and backflow circulation paths, whereby the liquid working fluid 32 in the capillary structure will not block the spreading path of the vapor working fluid 31 and crowd the vapor working fluid 31 out as in the conventional capillary structure.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A capillary structure comprising:
a main body having at least one internal closed space, the main body having a top layer formed with multiple passages in communication with the closed space of the main body and
multiple column bodies disposed in the closed space, the column bodies and the passages being staggered from each other, wherein a diameter of each of the multiple column bodies is greater than or equal to an aperture size of each of the multiple passages for each of the multiple column bodies entire height.

2. The capillary structure as claimed in claim 1, wherein the main body has a bottom layer having at least one sink, the sink having an open side and a closed side, the multiple column bodies upward extending from the closed side of the sink, the passage passing through the top layer between upper and lower sides of the top layer, the bottom layer and the top layer being sintered with each other to form an integrated body as the main body of the capillary structure, whereby the top layer blocks the open side of the sink of the bottom layer to define the closed space of the main body of the capillary structure.

3. The capillary structure as claimed in claim 1, wherein the closed space has a top side and a bottom side, two ends of the column bodies being respectively connected with the top side and the bottom side of the closed space.

4. The capillary structure as claimed in claim 2, wherein the bottom layer has a thickness and the top layer has a thickness, the thickness of the bottom layer being thinner than the thickness of the top layer.

5. The capillary structure as claimed in claim 2, wherein the bottom layer and the top layer are the same sort of capillary structures or different sorts of capillary structures.

6. A heat dissipation device comprising:
a heat dissipation device main body having an internal airtight chamber, a working fluid being filled in the airtight chamber, the heat dissipation device main body having an inner face proximal to the airtight chamber as a condensation face and another inner face proximal to the airtight chamber as an evaporation face, a capillary structure being disposed on a surface of the evaporation face, the capillary structure having a main body having at least one internal closed space, the main body having a top layer formed with multiple passages, the passages passing through the top layer in communication with the closed space, the top layer being not in contact with the condensation face, whereby a two-phase fluid circulation space is defined between the top layer and the condensation face, the closed space being in communication with the two-phase fluid circulation space through the multiple passages; and
multiple column bodies disposed in the closed space, the column bodies and the passages being staggered from each other, wherein a diameter of each of the multiple column bodies is greater than or equal to an aperture size of each of the multiple passages for each of the multiple column bodies entire height.

7. The heat dissipation device as claimed in claim 6, wherein the main body has a bottom layer having at least one sink, the sink having an open side and a closed side, the multiple column bodies being disposed on the closed side, the passage passing through the top layer between upper and lower sides of the top layer, the bottom layer and the top layer being sintered with each other to form an integrated body.

8. The heat dissipation device as claimed in claim 7, wherein the bottom layer and the top layer are the same sort of capillary structures or different sorts of capillary structures.

* * * * *